United States Patent
Narayanan et al.

(10) Patent No.: US 11,555,853 B2
(45) Date of Patent: *Jan. 17, 2023

(54) SCAN CHAIN SELF-TESTING OF LOCKSTEP CORES ON RESET

(71) Applicant: TEXAS INSTRUMENTS INCORPORATED, Dallas, TX (US)

(72) Inventors: Prakash Narayanan, Bangalore (IN); Nikita Naresh, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/093,702

(22) Filed: Nov. 10, 2020

(65) Prior Publication Data
US 2021/0055345 A1 Feb. 25, 2021

Related U.S. Application Data

(63) Continuation of application No. 16/372,252, filed on Apr. 1, 2019, now Pat. No. 10,866,280.

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31703* (2013.01); *G01R 31/31724* (2013.01)

(58) Field of Classification Search
CPC .......... G01R 31/3177; G01R 31/31724; G01R 31/31703
See application file for complete search history.

(56) References Cited

U.S. PATENT DOCUMENTS

| | | |
|---|---|---|
| 6,681,357 B2 | 1/2004 | Pendurkar |
| 6,918,074 B2 | 7/2005 | Kim et al. |
| 7,263,642 B1 | 8/2007 | Makar et al. |
| 8,205,125 B2 | 6/2012 | Hales et al. |
| 9,964,597 B2 | 5/2018 | Rangachar et al. |
| 2004/0130552 A1 | 7/2004 | Duluk, Jr. et al. |
| 2005/0154573 A1 | 7/2005 | Maly et al. |
| 2007/0011513 A1 | 1/2007 | Biswas et al. |
| 2007/0234157 A1 | 10/2007 | Rajski |
| 2011/0307750 A1 | 12/2011 | Narayanan et al. |
| 2012/0030532 A1 | 2/2012 | Jain et al. |

(Continued)

OTHER PUBLICATIONS

PCT International Search Report; PCT/US 2020/025996; dated Jun. 18, 2020; 2 pages.

*Primary Examiner* — Samir W Rizk
(74) *Attorney, Agent, or Firm* — Krista Y. Chan; Frank D. Cimino

(57) ABSTRACT

A system is provided that includes a memory configured to store test patterns. A first lockstep core and a second lockstep core are configured to receive the same set of test patterns. First scan outputs are generated from the first lockstep core, and second scan outputs are generated from the second lockstep core during a reset of the first lockstep core and the second lockstep core. A comparator can be coupled to the first lockstep core and the second lockstep core and is configured to compare the first scan outputs to the second scan outputs. The first and second lockstep cores can be initialized to a similar state if the first and second scan outputs are the same. The first and second lockstep cores can comprise non-resettable flip flops.

20 Claims, 4 Drawing Sheets

(56) References Cited

U.S. PATENT DOCUMENTS

2014/0101500 A1    4/2014    Bastimane
2016/0003900 A1    1/2016    Narayanan et al.
2018/0067164 A1    3/2018    Maheshwari et al.
2019/0303260 A1    10/2019    Ozer

SCAN CHAIN SELF-TESTING OF LOCKSTEP CORES ON RESET

CROSS-REFERENCE TO RELATED APPLICATIONS

The present application is a Continuation of U.S. patent application Ser. No. 16/372,252 filed Apr. 1, 2019, which Application is hereby incorporated herein by reference in its entirety.

BACKGROUND

Electronic systems can be used in applications related to a wide variety of fields such as automotive, healthcare, defense, satellites, networking, communication, consumer electronics, and other electrical applications. For example, the number of Electronic Control Units (ECUs) being used in automobiles range from ten to over a hundred. Widespread usage of electronic systems raises new challenges in terms of meeting safety requirements in, for example, ECUs.

One way to address safety requirements is for the electronic systems to be equipped with fault-tolerant and self-test capabilities. A fault-tolerant electronic system can be designed to run the same set of operations at substantially the same time. The electronic system can therefore use two or more redundant systems to allow error detection and error correction. Electronic systems that have two or more redundant subsystems can therefore operate in "lockstep," where each subsystem is set up to progress in parallel and substantially concurrent with one another, from one well-defined state to the next well-defined state. For example, when a first logic subsystem and a second logic subsystem are redundant (i.e., the same), and both receive the same input at substantially the same time, the first and second logic subsystems are known as lockstep subsystems placed in a lockstep mode of operation. As lockstep subsystems in a lockstep mode of operation with each other, the logic values output from the first logic subsystem are expected to be the same as, and arrive at the output at substantially the same time as, output from the second logic subsystem.

Redundant, fault-tolerant lockstep subsystems include sequential logic that operates in sequential operating states, with one sequential lockstep subsystem, or lockstep core, operating in duplicate and substantially concurrent with the other. Operating in parallel, duplicate and substantially concurrent with each other, the redundant lockstep cores containing sequential logic operate in lockstep mode to improve data integrity and overall safety of the electronic system. Two or more lockstep cores operating in lockstep mode of operation may have a common instruction stream and a synchronized clock. The results of each instruction applied in parallel to each of multiple duplicate lockstep cores are expected to produce identical output at substantially the same time. The lockstep cores operating in lockstep mode of operation can be integrated into a single integrated circuit die, or onto multiple dies in a single die package.

SUMMARY

In accordance with at least one example of the disclosure, a system comprises a memory configured to store test patterns. A first lockstep core and a second lockstep core are configured to receive the same set of test patterns. First scan outputs are generated from the first lockstep core, and second scan outputs are generated from the second lockstep core during a reset of the first lockstep core and the second lockstep core. A comparator can be coupled to the first lockstep core and the second lockstep core and configured to compare the first scan outputs to the second scan outputs.

In accordance with at least one other example of the disclosure, a method comprises applying a set of test patterns concurrently to a first plurality of scan chains and a second plurality of scan chains during a reset of a first and second lockstep cores. A first lockstep core can comprise the first plurality of scan chains and the second lockstep core comprises the second plurality of scan chains. Generating a first set of scan outputs from the first plurality of scan chains and a second set of scan outputs from the second plurality of scan chains can occur, and the first set of scan outputs can be compared to the second set of scan outputs. The first and second lockstep cores can be initialized to a similar state if the first and second set of scan outputs are the same.

BRIEF DESCRIPTION OF THE DRAWINGS

For a detailed description of various examples, reference will now be made to the accompanying drawings in which.

DETAILED DESCRIPTION

Lockstep cores can have storage elements that store the sequential states internal to each core. The storage elements can be or can include registers, and the registers may not always be checked for agreement. However, the external activity of the lockstep cores may be compared to determine if the electronic system has met safety requirements.

For example, if one of the lockstep cores is corrupted or develops a hardware fault or error, the lockstep core may execute an incorrect instruction, and/or use incorrect data, thereby producing incorrect results. The fault or error can be determined by comparing the output of one lockstep core to the output of the other lockstep core. However, if the outputs from the instructions commonly applied with zero or more delay between the two lockstep cores match among the cores, the cores will continue with the next instruction. If the outputs do not match, possibly due to a hardware fault in one of the lockstep cores, an error is detected and a signal is sent indicating the error.

Data integrity intended to meet higher safety requirements in certain electronic systems can therefore be partially achieved when the logic circuits, or cores, are operating in lockstep mode. To further enhance safety and data integrity, the lockstep cores can include self-test controllers. The self-test controllers can periodically self-test the cores to ensure data integrity among the cores. For example, a self-test controller can be configured to apply test patterns such as pre-defined test patterns, pseudo-random or random test patterns. The self-test controller can apply the test patterns to the lockstep cores to periodically test those cores. For example, an error is detected on the lockstep cores if the same test pattern is applied to each of the lockstep cores and the scan outputs from the cores do not match.

The logic circuits or subsystems of the lockstep cores can include storage elements or devices. Moreover, the storage devices can include flip flops, and those flip flops can be non-resettable. When power is applied or reset occurs, the logic values within the storage devices can become non-deterministic and they may transition to an undesirable state, or they can maintain different logic values or states within one lockstep core relative to the other lockstep core.

Figure 1:
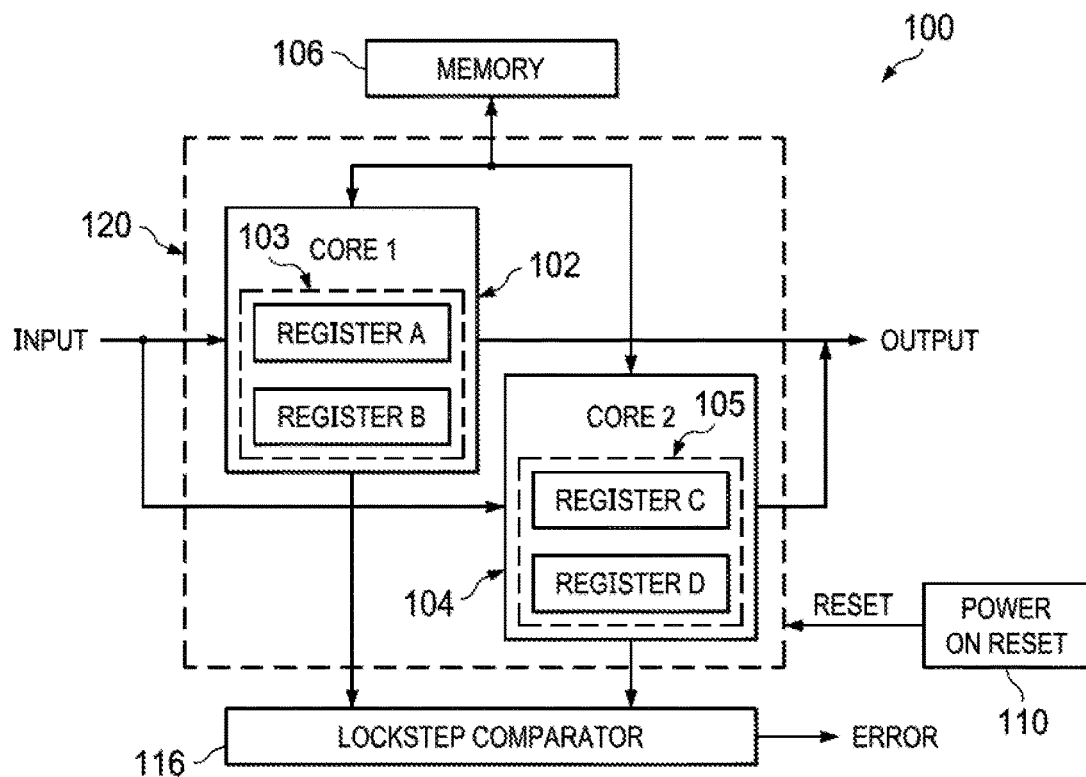
FIG. 1 shows a block diagram of a multi-core electronic system operating in lockstep mode and undergoing reset in accordance with various examples.

FIG. 1 depicts an electronic system 100 according to one example. Electronic system 100 can include a fault-tolerant system of redundancy that includes a first lockstep core 102 and a second lockstep core 104. Lockstep cores 102 and 104 can receive instructions and data from memory 106. A common instruction stream can be sent from memory 106 to first lockstep core 102 and second lockstep core 104 if the lockstep cores are processing cores, for example. Each of the lockstep cores 102 and 104 can include volatile storage devices that store the logic states within the lockstep cores. For example, storage device 103 in lockstep core 102 can include state registers RA and RB, and storage device 105 in lockstep core 104 can include state registers RC and RD. Storage device 103 can be a volatile storage device coupled in combinatorial and sequential logic for storing data corresponding to the internal states of the lockstep core 102, and storage device 105 can be a volatile storage device coupled in combinatorial and sequential logic for storing data corresponding to the internal states of the lockstep core 104.

One or more of those storage devices may not have a reset input, and therefore are non-resettable. When power is applied to the electronic system 100, for example, the registers RA and RB of storage device 103 can become initialized to a logic value that is different from registers RC and RD of storage device 105. Accordingly, the internal logic states or logic values in lockstep core 102 can differ from the internal logic state or logic values in lockstep core 104. The difference in logic states or values from one lockstep core 102 to the other lockstep core 104 during startup, power on, power on reset, reset, or the initial application of power to the cores 102 and 104, is due in part to the storage devices 103 and 105 of the lockstep cores 102 and 104, respectively, being non-resettable, or at least non-resettable to a deterministic logic value or state that is similar within the first lockstep core 102 relative to the second lockstep core 104. Most storage devices, or flip flops, are non-resettable.

During a power on reset, a reset signal (RESET) can be sent from an actuator or power on reset module 110 to lockstep cores 102 and 104. The logic values or states (hereinafter "logic states") of the storage devices 103 and 105 of lockstep cores 102 and 104 can be read during the power on reset operation. If the logic states stored in registers RA and RB of storage device 103, or any memory device within first lockstep core 102 are the same as the logic states stored in RC and RD of storage device 105 of second lockstep core 104, as read by comparator 116, then the lockstep cores 102 and 104 are correctly initialized at power-up and normal lockstep mode operation can thereafter begin. However, because the storage devices 103 and 105 can be flip flops which are not resettable, lockstep comparator 116 will determine the value of the logic states read from the lockstep cores 102 and 104. The logic states may not match, even though they should since the lockstep cores 102,104 are duplicative of each other and the logic states output from the lockstep cores 102, 104 should be in lockstep and equal. If the logic states internal to the lockstep cores 102, 104 do not match, then lockstep comparator 116 can send an error signal (ERROR).

The non-resettable storage devices 103, 105 can be of a fixed and defined length within the respective lockstep cores 102 and 104. Since the length is fixed in both storage devices 103 and 105, and the same within storage device 103 as compared to storage device 105, the amount of time needed to determine the cores 102,104 are initialized to identical values after reset is fixed, and the length of time to make that determination is relatively short. It may be desirable, however not necessary, to disable lockstep comparator 116 for the relatively short period of time until the lockstep cores are determined to be correctly initialized to the same values. Once confirmed, the reset operation is discontinued and normal operation occurs thereafter. Normal operation includes sending, for example, data into a circuit 120 having two or more lockstep cores 102 and 104, via the input channel containing an input signal (INPUT), with data sent from circuit 120 via an output channel containing an output signal (OUTPUT).

In addition to including lockstep cores 102 and 104, and initializing those cores to a common value or state on reset, fault-tolerant electronic systems that meet safety requirements can also include a self-test controller. The self-test controller used for fault-tolerant electronic systems can beneficially be used for scan chain testing during power on reset to initialize the non-resettable storage devices 103, 105 in lockstep cores 102,104.

Figure 2:
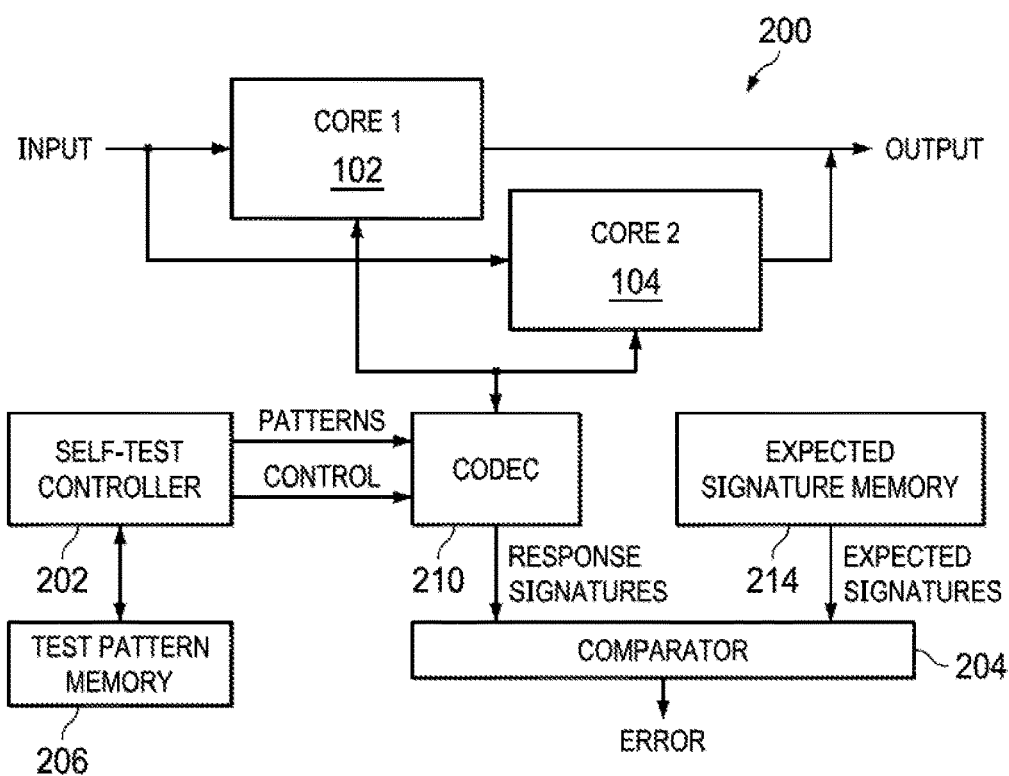
FIG. 2 shows a block diagram of a multi-core electronic system operating in lockstep mode and undergoing reset using at least a self-test controller and a test pattern in accordance with various examples.

FIG. 2 illustrates an electronic system 200 that includes a self-test controller 202 included with lockstep cores 102 and 104. Self-test controller 202 may be a Logic Built-In Self-Test (LBIST) controller configured on the same semiconductor substrate, or die that includes the lockstep cores 102 and 104. In another example, the self-test controller 202 and each of the lockstep cores 102 and 104 can be distributed on different dies and are communicably associated so as to perform self-test of the lockstep cores 102 and 104. The self-test controller 202 can include a clock generator and a circuit for applying test patterns from memory or from a pseudo-random generator. The clock generator may be configured to generate a clock signal for each test cycle. Comparator 204 can be configured to analyze scan outputs, such as test response signatures received from Compressor and Decompressor (CODEC), hereinafter "codec" 210 coupled to lockstep cores 102 and 104.

Test pattern memory 206 can store one or more test patterns. Alternatively, test patterns can be derived from a Pseudo-Random Pattern Generator (PRPG). The test patterns can be extracted by self-test controller 202 from a PRPG and/or from test pattern memory 206 for scan testing of the lockstep cores 102 and 104. Test pattern memory 206 can include a Read Only Memory (ROM), Random Access Memory (RAM), and any other volatile or non-volatile memory. Test pattern memory 206 can include a plurality of memory locations for storing the test pattern of logic value 1s and 0s. The test patterns drawn from test pattern memory 206 can be the same as the patterns sent from self-test controller 202 to scan compression circuit of a codec 210.

For scan testing upon power-on reset of lockstep cores 102 and 104, the test patterns are applied via codec 210 in parallel and substantially concurrently to lockstep cores 102, 104 with possible signal path delay from one lockstep core 102 to the other lockstep core 104. The test patterns of a plurality of logic 1 and logic 0 values are sent from self-test controller 202 as scan inputs from codec 210 to lockstep cores 102 and 104 at each transition of a scan clock provided as part of the control signal sent from self-test controller 202. For example, the test patterns from self-test controller 202 are coupled to the decompressor of codec 210 and the decompressor decompresses the set of test patterns into scan inputs. The scan inputs are further applied to the plurality of scan chains for the scan testing of the lockstep cores 102 and 104.

A compressor or compactor within codec 210 receives outputs from the plurality of scan chains and compacts those outputs into compacted or compressed scan outputs, also referred to as test response signatures. In one example, the compacted scan outputs are provided in the form of test response signatures. As shown, the response signatures can then be sent to comparator 204, for example. The scan outputs may not necessarily be in the form of the test response signatures, and can be in other suitable forms of scan outputs if the scan outputs are not compacted. If the comparison by comparator 204 is performed on the compacted scan outputs of the test response signatures, then the comparison or measurement occurs after the first shift-in or loading of the scan inputs into, for example, a Multiple Input Signature Register (MISR) compactor or compressor.

Comparator 204 operates with two comparator functions. The first comparator function is to compare the logic states internal to the lockstep cores 102, 104 during each functional access operation. The second comparator function is to compare the test response signatures of lockstep core 102 with the test response signature of lockstep core 104. Comparing the test response signatures forms a portion of the self-test controller functionality and the production of scan outputs during scan chain testing. The internal logic states from a non-resettable set of flip flops of storage device 103 within first lockstep core 102 will scan out from lockstep core 102 substantially synchronized with the internal logic states from a non-resettable set of flip flops of storage device 105 within second lockstep core 104. If the internal logic values between lockstep cores 102 and 104 do not match after power on reset, then an error will be indicated. Comparator 204 can also compare the test response signatures with expected signatures stored in expected signature memory 214. Expected signature memory 214 can be the same memory as test pattern memory 206 with the expected signatures addressed in a different location within that memory from the addressed test pattern locations. Comparator 204 can compare the scan outputs or response signatures generated from lockstep cores 102 and 104 with each other, and/or with the expected signatures in memory 214, to determine fault within the lockstep cores 102 and 104. In addition, comparator 204 can compare the compacted scan outputs, or test response signatures, from first lockstep core 102 to the compacted scan outputs, or test response signatures, of the second lockstep core 104. If the same patterns were applied substantially at the same time and in parallel to both lockstep cores 102, 104 and the compacted scan outputs are different among the lockstep cores 102, 104, then fault can be determined in at least one lockstep core 102, 104.

Figure 3:
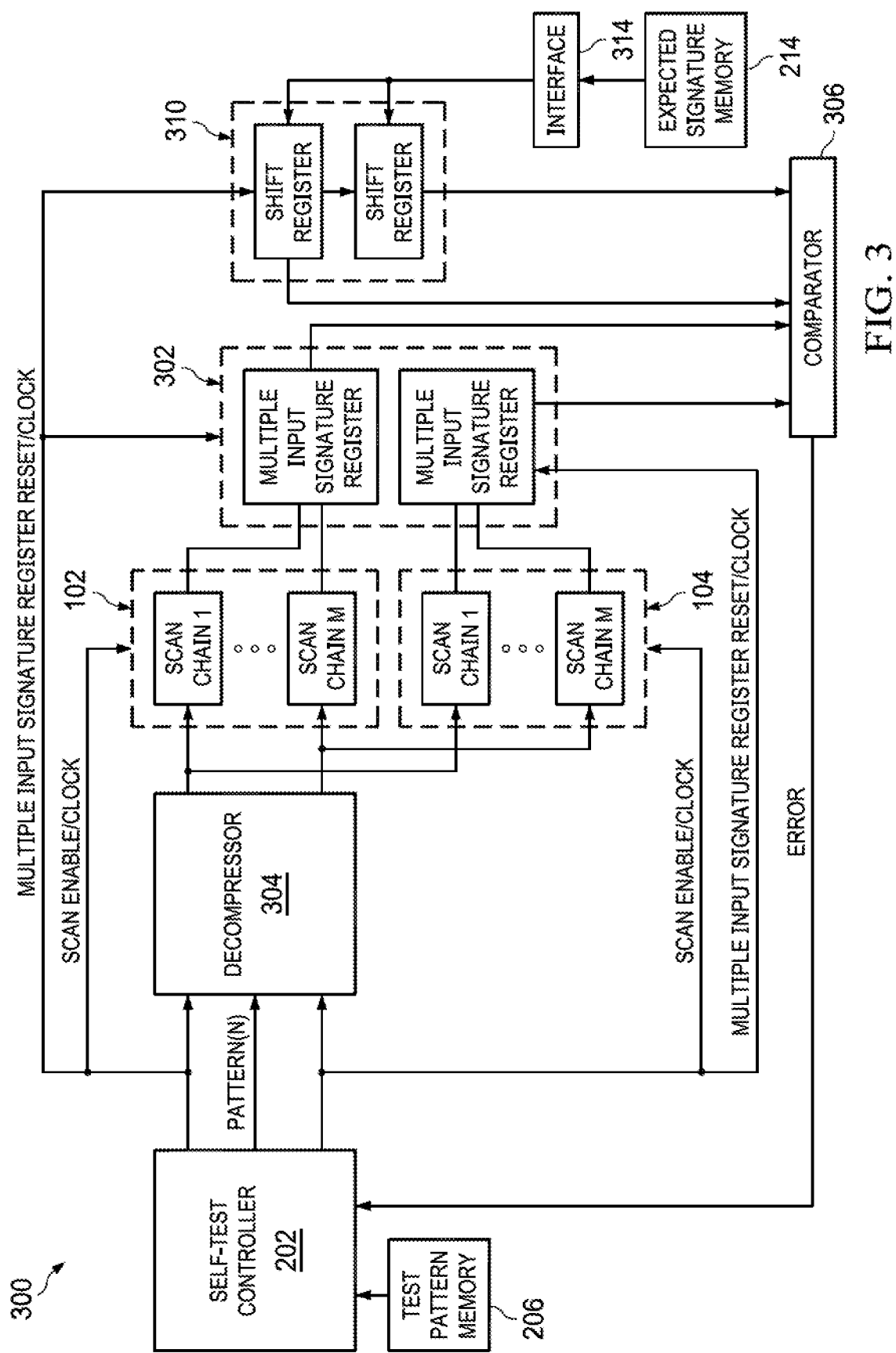
FIG. 3 shows a block diagram of a multi-core electronic system operating in lockstep mode and undergoing reset using at least a self-test controller, a test pattern, and scan chains in accordance with various examples.

According to the block diagram shown in FIG. 2, lockstep cores 102 and 104 are configured to include scan chains implemented during self-testing upon reset. The scan chains may use compression; however, compression and decompression is not necessarily needed to carry out lockstep core initialization upon reset of non-resettable storage devices. If compression is used, lockstep cores 102 and 104 can be coupled to a decompressor and a compressor alternatively referred to as a compactor. The decompressor and compactor can be included within codec 210. FIG. 3 illustrates functionality of a scan chain system implemented on an electronic system 300 during power on reset.

Testing can involve compression. Within the compressor, or compactor 302 of an electronic system 300 undergoing tests or test on reset, the compressor 302 can include a Multiple Input Signature Register (MISR), or possibly multiple MISRs. One or more MISRs are activated to compress M different scan chains SC1-SCM from N different scan inputs derived from test patterns sent to decompressor 304. Variables M and N are integer numbers greater than zero. The MISR is configured to provide N test response signatures for an electronic circuit 300 based on M different scan chains. As used herein, the term "circuit" or "system," when referring to an electronic circuit or an electronic system can include a collection of active and/or passive elements that form a circuit function, such as an analog circuit, control circuit, or digital circuit. The active and/or passive elements can be fabricated on a common substrate or fabricated on multiple different substrates yet packaged together, for example. The term "MISR output" of the test response signatures sent to comparator 306, refers to a data value stored in the MISR after at least one bit from each of the scan chains has been clocked into the MISR. The MISR can include a circuit of flip-flops proceeded by exclusive OR logic that is at the output of each scan chain. The MISR can generate a complete signature if the contents from the scan chains SC1-SCM are clocked into the MISR. In the example of FIG. 3, the scan inputs receive the test patterns from decompressor 304. Decompressor 304 expands the sequence of test patterns from, for example, N parallel-fed bits to M bits.

Data in the respective scan chains SC1-SCM can reflect output responses and, specifically, from the lockstep cores 102 and 104. Self-test controller 202 not only sends the test patterns to decompressor 304, but also sends a control signal comprising scan enable (SCAN EN) as well as a scan clock (SCAN CLK) to the scan chains. Also, the control signal can include a MISR reset (MISR RST), as well as a MISR clock (MISR CLK), sent to compressor 302 as well as possibly one or more shift registers 310. The electronic system 300 need not include compression of the scan chains. Instead, full (non-compressed) scan chains can be configured in lockstep cores 102 and 104 absent any decompressor 304 or compressor 302.

Each of the plurality of SC1-SCM scan chains 1 through M can hold one or more test data bits to test lockstep cores 102 and 104. Each of the plurality of SCM1-SCM scan chains 1 through M in lockstep core 102 is preferably the same length and contains the same number of bits. Also, each of the plurality of SC1-SCM scan chains 1 through M in lockstep core 104 is preferably the same length in lockstep core 104, and preferably the same length as the SC1-SCM scan chains in lockstep core 102 and also contains the same number of bits as in lockstep core 102. One or more shift registers 310 can be loaded from an interface 314 and can hold one of N comparison signatures, where N is a variable integer number greater than zero. The comparison signatures are alternatively referred to as expected signatures obtained from expected signature memory 214. The expected signatures are used to validate and to initialize response signatures sent to compressor 302 as scan outputs from the scan chains SC1-SCM. Interface 314 can be implemented as a Joint Test Action Group (JTAG) interface. Other interfaces are possible including custom interfaces (serial or parallel). In an alternative example, shift register 310 may not be provided. Instead, the contents of MISR of compressor 302 can be shifted out directly to comparator 306 for comparison with the expected signatures from expected signature memory 214.

If compression is used, compressor 302 can include one, or possibly two or more MISRs. If two MISRs are used, then a first MISR can receive scan chain SC1-SCM outputs (scan outputs) from first lockstep core 102 and a second MISR can receive scan chain SC1-SCM scan outputs (scan outputs) from second lockstep core 104. The compressed or compacted scan outputs from each MISR can be sent to comparator 306. Comparator 306 will then compare the compacted scan outputs derived from one lockstep core 102 to the compacted scan outputs derived from another lockstep core 104 to determine if they are the same. The scan outputs from core 102 is expected to be the same as the scan outputs from core 104 since the same scan inputs are sent substantially concurrently to both core 102 and 104 with cores 102,104 being redundant, lockstep cores. If the scan outputs from SC1-SCM scan chains are the same, the lockstep cores 102 and 104 can be initialized upon reset to the same state. If the scan outputs from SC1-SCM scan chains from core 102 as compared by comparator 306 are not the same as the scan outputs from SC1-SCM scan chains from core 104, then an error or fault signal can be sent from comparator 306. Comparator 306 can also send an error or fault signal if the compacted scan outputs upon reset, do not match the expected signatures from memory 214.

If one or more shift registers 310 are implemented to make the comparison between the expected signatures and test response signatures, then interface 314 can include a processor or self-test controller. The processor or controller within interface 314 controls loading and unloading of the shift register 310, and to control the data exchanges between MISR of compressor 302 and the shift register 310. In one example, the interface 314 retrieves the expected signatures from the expected signature memory 214 (e.g., file or memory location) and loads the shift register 310. In another example, interface 314 can be provided as an on-chip controller to access the MISR of compressor 302. Interface 314 maintains a bit-by-bit, synchronized loading of shift register 310 relative to loading of MISR of compressor 302. Synchronizing the loading of shift register 310 and MISR of scan outputs allows comparator 306 to compare the logic values of each bit of the response signatures to each other (among cores 102,104) and to the expected signatures to isolate the fault on a bit-level within one or more lockstep cores 102, 104. Comparator 306 performs bit-to-bit and/or pattern-to-pattern comparison. Electronic system 300 can also send output from the comparator block 306 to, for example, the self-test controller 202. If any failed bits within a pattern among compared scan outputs are detected, an error signal (ERROR) can be sent.

Figure 4:
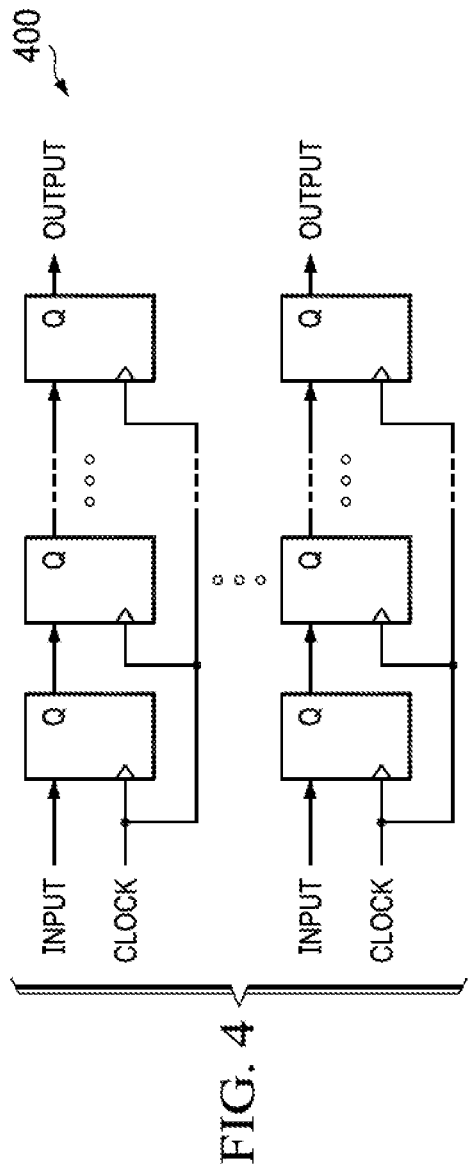
FIG. 4 shows a block diagram of non-resettable sequential logic arranged in a multi-core electronic system operating in lockstep mode in accordance with various examples.

FIG. 4 shows storage devices 400 that do not have a reset input and therefore are non-resettable upon power on reset. The storage devices 400 can be flip-flops and specifically, non-resettable flip-flops. The storage devices can be coupled together within sequential logic of lockstep cores 102, 104. In particular, the non-resettable storage devices 400 can be included with storage devices 103 and 105 (FIG. 1) of lockstep cores 102 and 104, respectively. In addition to their presence in lockstep cores 102, 104, non-resettable storage devices 400 can be configured within the registers RA and/or RB. The non-resettable storage devices 400 can be configured into scan chains SC1-SCM to receive a scan input or test pattern upon reset, and to produce a scan output. Upon reset, the non-resettable storage devices 400 will maintain their internal logic value or state, which is non-deterministic and dissimilar within core 102 relative to core 104. Upon reset, however, the non-deterministic state can be flushed from the storage devices 400 of lockstep cores 102, 104 and be brought to the same deterministic state after reset with one lockstep core internal state initialized to the other lockstep core internal state via scan chain application of a test pattern scan input vector implemented via self-test controller 202.

Figure 5:
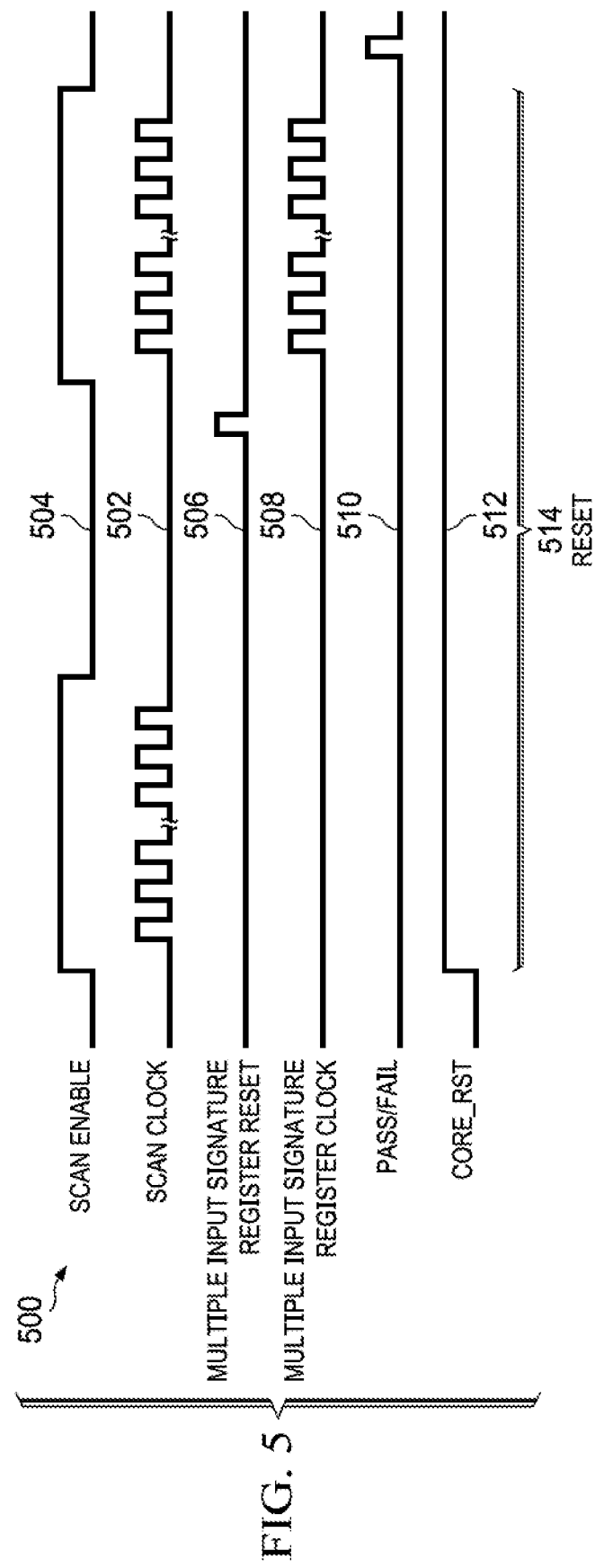
FIG. 5 shows a timing diagram of test pattern testing of scan chains upon reset of lockstep cores to initialize the cores according to various examples.

FIG. 5 illustrates an example timing diagram 500 for scan chain testing and comparing scan outputs upon reset. On the left of diagram 500, various interface signals are shown. The interface signals can include a scan clock (SCAN CK) 502 to clock data out of the scan chains whenever the scan cells of the scan chains are enabled via scan enable (SCAN EN) 504. A MISR reset (MISR RST) 506 can reset the MISR or MISRs of the compressor 302 shown in FIG. 3. A MISR clock (MISR CLK) 508 can clock data to and from the MISR of the compressor 302. The scan clock can shift the test pattern of logic states within each lockstep core 102, 104 onto the MISR compressor. The MISR compressor can then receive a reset (MISR RST) 506 so that the scan output is received on its input. The MISR then shifts the scan output upon receipt of the MISR CLK 508 synchronized to the scan clock. The shifted MISR output is applied to the comparator 306 (FIG. 3) to determine whether a match among scan outputs among cores 102,104 or between scan outputs from the cores 102,104 and expected scan outputs occur. If a match does not exist then an error signal (PASS/FAIL) 510 will transition to the appropriate value and the PASS/FAIL 510 can be sent from comparator 306 signaling the lockstep cores 102,104 have not been initialized upon reset.

If lockstep cores 102, 104 are to be initialized upon reset (CORE RST) 512 when CORE RST 512 transitions during RESET 514 to an appropriate logic value, initialization can include the comparison between one MISR output to the other MISR output so that the scan outputs derived from each lockstep core are compared to each other. Initialization can therefore be performed during the reset (RESET) 514 of the lockstep cores. A lockstep core reset includes a RESET period 514 in which the lockstep cores 102,104 are initialized to the same internal logic states. If the lockstep cores are initialized to the same internal logic states to operate thereafter in the lockstep mode of operation, in which instructions are executed in duplicate and in lockstep within the lockstep cores 102, 104 after reset, then it is desirable to initialize the lockstep cores in the same internal state before functional operation. Additional fault detection can be applied if the comparator 306 further compares the scan output response signatures from the lockstep cores 102,104 to the expected signatures.

Figure 6:
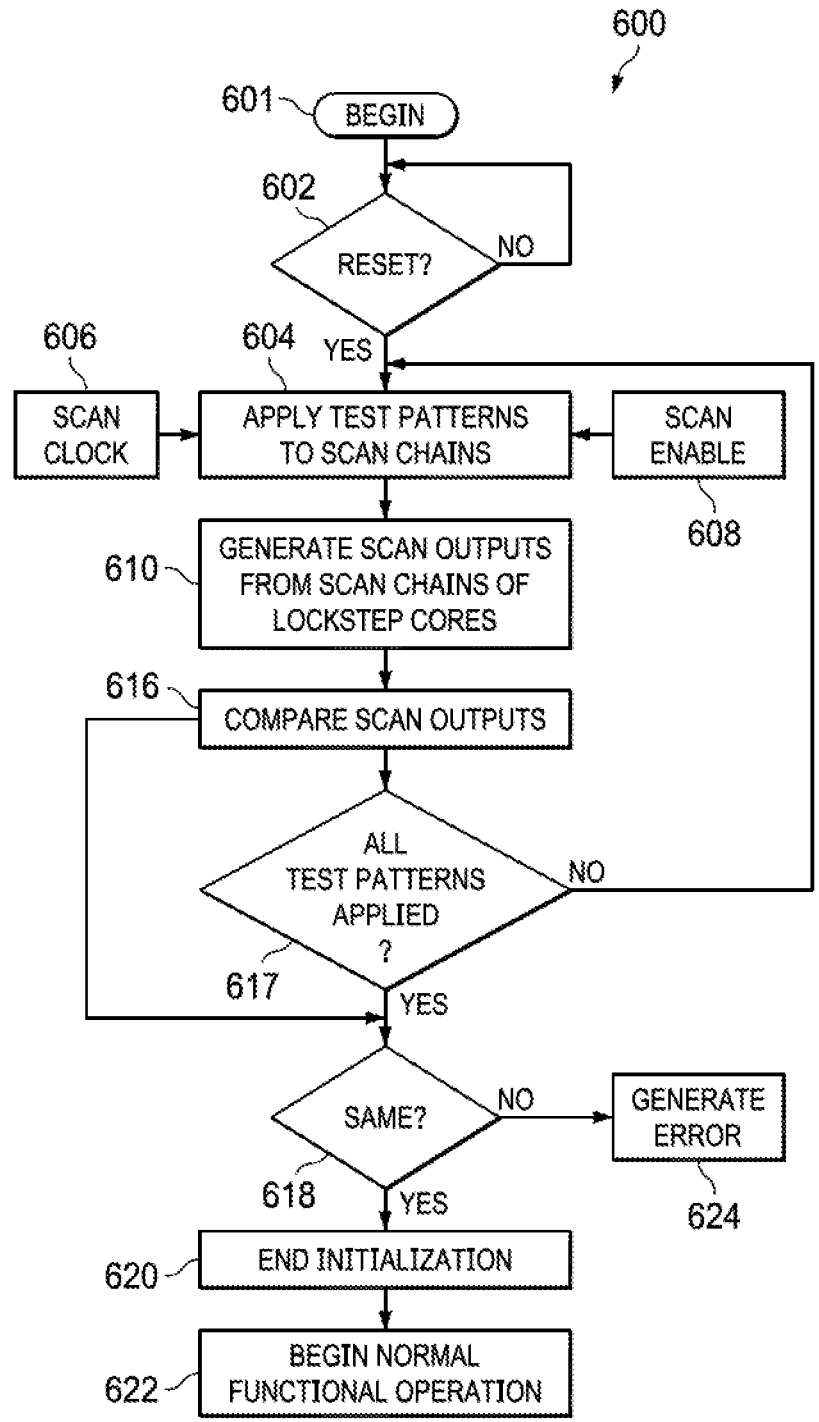
FIG. 6 shows a flowchart of test pattern testing of scan chains upon reset of lockstep cores, and comparing the scan outputs to initialize the lockstep cores according to various examples.

FIG. 6 illustrates a flow chart of an example method 600 of performing self-tests of one or more lockstep cores. The lockstep cores can be part of an electronic system, where the electronic system includes a self-test controller along with other components for performing self-test of the cores during reset of those cores. The other components can include compression logic that initializes the lockstep cores used as safety devices. The cores are hard macros, or intellectual property (IP) devices containing non-resettable storage devices or flip-flops that get flushed with the correct logic value upon power-up of the non-resettable storage devices. The non-resettable storage devices of the lockstep cores are therefore initialized at reset to identical values by using components that are already available for scan testing. For example, the self-test controller, as well as scan chains, can be used to initialize the lockstep core, and those chains and controllers would nonetheless be needed during normal periodic testing. Test patterns from the self-test controller are used to flush the non-resettable storage devices in both lockstep cores to the same values upon reset. Since the scan chain length of the lockstep cores are fixed, the initialization time for both lockstep cores 102,104 is the same and finite. If, for example, the scan chain of the lockstep cores under test is of length 64, 128, or 256 scan cells or storage devices, then the cores will get initialized in the same number of cycles determined by the scan shift frequency. If the scan shift frequency of the scan clock is 100 MHz or greater, the cores can be initialized in 640 ns or 1.28 ms or 2.56 ms, depending on the scan length, from the time the cores 102,104 are powered on, activated, or triggered on reset. The lockstep cores need not start operating functionally until they are initialized with the self-test controller and scan chains used to flush the states within the lockstep cores to determine equal states between lockstep cores.

The lockstep cores initialized upon reset using self-test controllers and scan chains provide higher compliance in terms of safety, and also provide for both lockstep cores to get initialized at reset before the lockstep cores are enabled functionally. The comparator logic can be enabled at reset and the lockstep cores will get initialized in less time while reusing the existing self-test controller and associated scan chains. At block 601, initialization of the lockstep cores begins. At block 602, a determination is made whether the lockstep cores are undergoing a power-on reset condition, or any condition in which reset is to occur yet the storage devices that storage logic state values within the cores are non-resettable. If a reset condition has occurred (e.g., during power up of the electronic system), then the scan chain will receive test patterns at 604 and a scan clock signal 606 and scan enable signal 608 trigger each scan chain to shift the test patterns through the plurality of scan chains and scan outputs are generated from those chains within with two or more lockstep cores, as shown by block 610.

A determination can be made on whether all test patterns have been applied to the scan chains at block 617. If all the test patterns have not been applied, then the scan process at block 604 is repeated, as well as the scan outputs generated at block 610. The scan outputs from the scan chains are applied to the MISR, for example, and the MISR performs its serial shift. At block 616 scan outputs from the scan chains, or response signatures, are then compared. Comparison 616 occurs between scan outputs derived from one lockstep core to another. A determination is then made at block 618 on whether the scan outputs (response signatures) of one lockstep core are the same as the scan outputs (response signatures) of the other lockstep core. If the scan outputs of the lockstep cores are the same, then initialization can end as shown by block 620, and normal functional operation of the lockstep cores can thereafter begin as shown by block 622. If the scan outputs (response signatures) of one lockstep core are not the same as the scan outputs (response signatures) of the other lockstep core at block 618, then an error signal is generated 624, and proper initialization to similar logic state values internal to the lockstep cores is not achieved. Moreover, if the scan outputs (response signatures) of one or both lockstep cores are not the same as the expected signatures, then an error signature is generated and sent 624, and proper initialization to an expected logic state values internal to the lockstep cores is not achieved.

In the foregoing discussion and in the claims, the terms "including" and "comprising" are used in an open-ended fashion, and thus should be interpreted to mean "including, but not limited to . . . ." Also, the terms "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrase "ground", or similar, in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
a first lockstep core having a first lockstep core memory;
a second lockstep core having a second lockstep core memory;
a self-test controller operatively coupled to the first lockstep core and the second lockstep core, and configured to:
after a start event of the first lockstep core and the second lockstep core, initialize the first lockstep core memory and the second lockstep core memory using a same set of test patterns;
generate first scan outputs from the first lockstep core in response to the initialized first lockstep core memory; and
generate second scan outputs from the second lockstep core in response to the initialized second lockstep core memory; and
a comparator coupled to the first lockstep core and the second lockstep core and configured to compare the first scan outputs to the second scan outputs.

2. The system of claim 1, wherein the first lockstep core memory comprises a first plurality of scan chains, and the second lockstep core memory comprises a second plurality of scan chains.

3. The system of claim 1, wherein:
the first lockstep core memory comprises a first scan chain;
the second lockstep core memory comprises a second scan chain;
the first scan chain comprises a first non-resettable flip flop having an input configured to receive the set of test patterns; and
the second scan chain comprises a second non-resettable flip flop having an input configured to receive the set of test patterns.

4. The system of claim 2, wherein the start event comprises at least one of: a startup, a power on, a power on reset, a reset, or an initial application of power to the cores.

5. The system of claim 2, further comprising a multiple input signature register (MISR) coupled to the first and second plurality of scan chains and configured to forward the first and second scan outputs to the comparator.

6. The system of claim 2, wherein the comparator is further configured to generate an error signal if the first scan outputs do not match the second scan outputs;
wherein the self-test controller is coupled to the comparator; and
wherein the self-test controller is configured to forward a control signal to the first lockstep core and the second lockstep core to cease operation of the first lockstep core and the second lockstep core after receiving the error signal.

7. The system of claim 1, wherein the comparator is configured to be disabled after the start event, and wherein the self-test controller is configured to enable the comparator after performing the initialize action.

8. The system of claim 1, further comprising:
a first multiple input signature register (MISR) coupled between the comparator and the first lockstep core comprising M first scan chains, where M is a variable positive integer number;
a second MISR coupled between the comparator and the second lockstep core comprising M second scan chains; and
wherein the M first scan chains and the M second scan chains are coupled to receive in parallel N test patterns, where N is a variable positive integer number.

9. A system, comprising:
a first lockstep core comprising a first plurality of non-resettable flip flops;
a second lockstep core comprising a second plurality of non-resettable flip flops;
a self-test controller operatively coupled to, the first lockstep core and the second lockstep core;
wherein the self-test controller is configured to, after a start event of the first lockstep core and the second lockstep core, cause the first plurality of non-resettable flip flops to be initialized using a set of the test patterns, and to cause the first lockstep core to generate first scan outputs in response to the initialized first plurality of non-resettable flip flops; and
wherein the self-test controller is configured to, after the start event of the first lockstep core and the second lockstep core, cause the second plurality of non-resettable flip flops to be initialized using the set of the test patterns, and to cause the first lockstep core to generate second scan outputs in response to the initialized second plurality of non-resettable flip flops; and
a comparator configured to be deactivated after the start event, to be activated after the first and second pluralities of non-resettable flip flops are initialized, to receive as inputs the first scan outputs and the second scan outputs, and to compare the first scan outputs to the second scan outputs.

10. The system of claim 9, wherein the first plurality of non-resettable flip flops are coupled in series, and wherein the second plurality of non-resettable flip flops are coupled in series.

11. The system of claim 9, further comprising:
a processor, wherein the processor comprises the first lockstep core, the second lockstep core, and the self-test controller;
wherein the first lockstep core and the second lockstep core are each configured to receive a common instruction stream.

12. The system of claim 9, wherein the self-test controller is coupled between the first and second plurality of non-resettable flip flops, and the comparator; and
wherein the comparator is configured to generate a signal based on the comparison between the first and second scan outputs and to output the signal to the self-test controller.

13. The system of claim 9, further comprising an expected scan output memory configured to store an expected scan output and coupled to the comparator;
wherein the comparator is configured to compare the first scan output to the expected scan output and to compare the second scan output to the expected scan output; and
wherein the comparator is configured to generate an error signal if: (1) the first and second scan outputs are different, (2) the first scan output is different from the expected scan output, or (3) the second scan output is different from the expected scan output.

14. A method, comprising:
applying, using a built-in self-test (BIST) controller, a set of test patterns to initialize a first plurality of scan chains and a second plurality of scan chains after a start event of a first lockstep core and a second lockstep core, wherein the first lockstep core comprises the first plurality of scan chains and the second lockstep core comprises the second plurality of scan chains;
generating a first set of scan outputs, using the first lockstep core, in response to the initialized first plurality of scan chains;
generating a second set of scan outputs, using the second lockstep core, in response to the initialized second plurality of scan chains;
comparing the first set of scan outputs to the second set of scan outputs; and
enabling the first and second lockstep cores in response to the comparing step determining that the first set of scan outputs is the same as the second set of scan outputs.

15. The method of claim 14, wherein applying the set of test patterns occurs without resetting a plurality of flip flops within the first and second lockstep cores.

16. The method of claim 14, further comprising:
comparing the first set of scan outputs to an expected set of scan outputs;
comparing the second set of scan outputs to the expected set of scan outputs; and
enabling the first and second lockstep cores in response to the comparing to the expected set of scan outputs steps determining that the first and second sets of scan outputs are respectively the same as the expected set of scan outputs.

17. The method of claim 14, further comprising generating an error signal if: (1) the first set of scan outputs is different from the second set of scan outputs, (2) the first set of scan outputs is different from an expected set of scan outputs, or (3) the second set of scan outputs is different from an expected set of scan outputs.

18. The method of claim 14, further comprising:
  loading the first set of scan outputs into a first multiple input signature register (MISR);
  loading the second set of scan outputs into a second MISR;
  updating the first MISR by clocking at least one bit from the first scan output;
  updating the second MISR by clocking at least one bit from the second scan output; and
  comparing an output from the first MISR to an expected set of scan outputs; and
  comparing an output from the second MISR to the expected set of scan outputs.

19. A method, comprising:
  during a start event of first and second lockstep cores, the first lockstep core comprising a first scan chain and the second lockstep core comprising a second scan chain:
    applying a test pattern, using a self-test controller, to initialize the first scan chain; and
    applying the test pattern, using the self-test controller, to initialize the second scan chain, wherein the first scan chain comprises a first set of non-resettable flip flops and the second scan chain comprises a second set of non-resettable flip flops.

20. The method of claim 19, further comprising:
generating a first scan output, using the first lockstep core, in response to the initialized first scan chain;
generating a second scan output, using the second lockstep core, in response to the initialized second scan chain;
comparing the first scan output to the second scan output; and
enabling the first lockstep core and the second lockstep core to begin operation in response to the comparing determining the first scan output and the second scan output are the same.

* * * * *